US006818378B2

(12) United States Patent
Endo

(10) Patent No.: US 6,818,378 B2
(45) Date of Patent: Nov. 16, 2004

(54) LITHOGRAPHIC PRINTING PLATE PRECURSOR

(75) Inventor: Akihiro Endo, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 30 days.

(21) Appl. No.: 10/302,879

(22) Filed: Nov. 25, 2002

(65) Prior Publication Data

US 2003/0186163 A1 Oct. 2, 2003

(30) Foreign Application Priority Data

Nov. 26, 2001 (JP) .................................... P. 2001-359270

(51) Int. Cl.[7] ................................................ G03F 7/038

(52) U.S. Cl. ............................... 430/270.1; 430/281.1; 430/283.1; 430/284.1; 430/285.1; 430/286.1; 430/964

(58) Field of Search ........................... 430/270.1, 281.1, 430/286.1, 964, 283.1, 284.1, 285.1

(56) References Cited

U.S. PATENT DOCUMENTS

| | | | | |
|---|---|---|---|---|
| 6,255,033 | B1 | | 7/2001 | Levanon et al. |
| 6,458,511 | B1 | | 10/2002 | Wittig et al. |
| 6,541,181 | B1 | * | 4/2003 | Levanon et al. ......... 430/275.1 |
| 6,555,617 | B1 | * | 4/2003 | Tanaka et al. ................ 525/61 |

FOREIGN PATENT DOCUMENTS

| | | |
|---|---|---|
| EP | 1 072 404 A1 | 1/2001 |
| WO | WO 99/11458 | 3/1999 |

* cited by examiner

*Primary Examiner*—Barbara Gilliam
(74) *Attorney, Agent, or Firm*—Sughrue Mion, PLLC

(57) ABSTRACT

A lithographic printing plate precursor comprising a support having provided thereon an image-recording layer containing a substance that absorbs light to generate heat, an aqueous alkali solution-soluble resin having phenolic hydroxy group and a polyvinyl acetal resin including an acid group having a pKa of not more than 5.

8 Claims, No Drawings

LITHOGRAPHIC PRINTING PLATE PRECURSOR

FIELD OF THE INVENTION

The present invention relates to an image recording printing plate precursor, which can be used as an offset printing master. More specifically, the present invention relates to a positive working photosensitive lithographic printing plate precursor for infrared laser suitable for so-called direct plate-making, which is capable of producing a printing plate directly by recording digital image signals formed by and output from a computer with an infrared laser beam.

BACKGROUND OF THE INVENTION

As systems conducting plate-making directly based on digital data of computer, there have been hitherto known (1) system using an electrophotographic method, (2) photopolymerization system using a combination of exposure with Ar laser and post-heating, (3) system using a laminate composed of a silver salt light-sensitive material on a photosensitive resin, (4) system using a silver salt diffusion transfer material, (5) system using destruction of a silicone rubber layer with discharge or a laser beam, and the like.

However, these systems are accompanied with some difficulties. Specifically, the system using an electrophotographic method of (1) has problems in that the process including electrostatic charge, exposure, development, etc. is complicated and in that a complex and large-scaled machine is employed. The system of (2) requires not only the post-heating step but also a highly sensitive printing plate material, which causes difficulty in handling in a light room. The systems of (3) and (4) have problems of complicate processing and high cost due to employing the silver salt. The system of (5) has a problem in removing silicone residue remaining on the surface of printing plate material, although it has a relatively high percentage of completion. On the other hand, with remarkable progress of laser technologies in recent years, high output and compact solid laser or semiconductor laser devices having a light emission region in the range from near infrared to infrared become easily available. These laser devices are very useful as a light source for exposure in the production of a printing plate directly from digital data of computer or the like.

In a conventionally known positive working lithographic printing plate precursor material for infrared laser suitable for direct plate-making, an aqueous alkali solution-soluble resin having phenolic hydroxy group, for example, a novolak resin, is used as an aqueous alkali solution-soluble polymer compound. In such a positive working lithographic printing plate precursor, the association state of cresol novolak resin is changed by the action of heat generated from a light-heat converting agent in the exposed area to cause discrimination in solubility between the exposed area and the unexposed area, thereby carrying out plate-making. However, since the difference in dissolution speed between the exposed area and the unexposed area is small, a slight fluctuation of the alkali activity of a developer is apt to adversely affect the actual plate-making operation, resulting in lack of stability.

Thus, development of techniques for enlarging development latitude using an alkali dissolution interceptor (dissolution inhibitor) has been actively made. For instance, a resist material containing as the dissolution inhibitor, a (phenol pendant) acetal polymer having a specific structure is disclosed in WO 01/09682A2, a composition containing as the dissolution inhibitor, a polymer having a specific pendant group (including a hydroxy group or a carboxylic acid group) is proposed in WO 99/11458A, a printing plate precursor containing as the dissolution inhibitor, a polymer having at least one of ortho carboxylic acid, acetal and ketal graft chain and a photo-acid generator is disclosed in JP-A-10-87733 (the term "JP-A" as used herein means an "unexamined published Japanese patent application"), and an image recording material containing as the dissolution inhibitor, a hydroxyacryl polymer partially esterified is disclosed in European Patent 1,072,404A. However, these printing plate precursors are still insufficient in the discrimination.

An image recording material comprising an aqueous alkali solution-soluble resin having phenolic hydroxy group, for example, a novolak resin, a substance that absorbs light to generate heat, various onium salts and quinonediazide compounds is proposed in JP-A-7-285275. In such an image recording material, while the onium salt or quinonediazide compound functions as the dissolution inhibitor for substantially decreasing the solubility of the aqueous alkali solution-soluble resin in the exposed area, it is decomposed by heat in the exposed area so that it cannot act as the dissolution inhibitor, whereby an image is formed. However, since the onium salt or quinonediazide compound has light absorption region (350 to 500 nm) in a visible range, a place for handling the image recording material is disadvantageously restricted to a place illuminated with a yellow light. Also, a printing plate obtained is required to reuse by cleaning with a solvent, for example, a cleaner solution in order to use the printing plate for a long period of time. However, since the novolak resin is inferior in the solvent resistance, the printing plate has a problem in that printing durability is degraded when the cleaner solution is used during printing.

It is also described in JP-A-7-285275 that an acrylic resin or urethane resin can be used together with the onium salt or quinonediazide compound. Since there is no description regarding dissolution inhibiting or dissolution accelerating property of the acrylic resin or urethane resin to the aqueous alkali solution-soluble resin having phenolic hydroxy group in the patent, the addition of acrylic resin or urethane resin is not intended to dissolution inhibition of the aqueous alkali solution-soluble resin having phenolic hydroxy group. It is disclosed, however, that durability of the printing plate can be improved by the addition of acrylic resin or urethane resin.

It is described in U.S. Pat. No. 6,152,036 that insolubilization of surface layer due to a hardening reaction of novolak is also effective for the enlargement of development latitude and the hardening reaction is accelerated by adding an epoxy compound. Further, in JP-A-11-338131, it is disclosed that the development stability is improved by using an anionic metal complex having a heat-decomposable counter cation, as an infrared absorbing agent.

In JP-A-10-153863, it is disclosed that the stability of development is improved by using a specific metal complex or salt together with a specific binder having a hydrophilic group. It is disclosed in JP-A-2001-92126 that an organic compound containing an inorganic salt of metal selected from metals of Group IIIA of the periodic table and transition metals is used as the dissolution inhibitor, although the mechanism thereof is not clear. It is believed that the increase in discrimination of solubility described in these techniques disclosed is caused by the generation of dissolution inhibiting effect due to interaction between the binder and the metal compound. On the other hand, it is recognized to decrease the development stability and reproducibility of development latitude by means of influence to stability of the coating solution and influence of thermal history at the drying after coating to performances, which may also result from the interaction between the binder and the metal compound.

As described above, in the conventionally known positive working lithographic printing plate precursors for infrared laser suitable for direct plate-making, the approach for increasing the discrimination in the solubility between the image area and the non-image area fails to successively combine with practically necessary characteristics, for example, solvent resistance, safety to visible light, durability and production stability.

SUMMARY OF THE INVENTION

The present invention has been made against such a background. Therefore, an object of the present invention is to improve image-forming property, production stability and plate-making workability of a printing plate precursor containing an aqueous alkali solution-soluble resin having phenolic hydroxy group and a light-heat converting agent thereby resolving the above-described problems of conventional techniques. Specifically, an object of the present invention is to provide a positive working photosensitive lithographic printing plate precursor for infrared laser suitable for direct plate-making, which is excellent in stability of the coating solution, has no restrictions on the place of handling, and exhibits good discriminative developability, development stability, development latitude and press life.

Other objects of the present invention will become apparent from the following description.

As a result of extensive investigations to resolve the above-described problems, which damage practical characteristics of lithographic printing plate precursors, it has been found that incorporation of a polyvinyl acetal resin including an acid group having a pKa of not more than 5 into an image-recording layer of a lithographic printing plate precursor is effective to remove the above-described disadvantages. The present invention has been accomplished by further investigations based on such a finding. More specifically, the present invention provides the lithographic printing plate precursors described below.

1. A lithographic printing plate precursor comprising a support having provided thereon an image-recording layer containing a substance that absorbs light to generate heat, an aqueous alkali solution-soluble resin having phenolic hydroxy group and a polyvinyl acetal resin including an acid group having a pKa of not more than 5.
2. The lithographic printing plate precursor as described in item 1 above, wherein the polyvinyl acetal resin is a polyvinyl acetal resin having an ester linkage group with an organic acid selected from the group consisting of 1,2-cyclohexanedicarboxylic acid, tetrahydrophthalic acid, phthalic acid and trimellitic acid.

DETAILED DESCRIPTION OF THE INVENTION

A feature of the present invention resides in the incorporation of a polyvinyl acetal resin including an acid group having a pKa of not more than 5 (hereinafter also referred to as an acid-modified polyvinyl acetal resin) into an image-recording layer containing a substance that absorbs light to generate heat and an aqueous alkali solution-soluble resin having phenolic hydroxy group. According to the present invention, the incorporation of acid-modified polyvinyl acetal resin is specifically effective for improving the development latitude. When an unmodified polyvinyl acetal resin, which does not have any acid group, is used, the effect of improvement in the development latitude cannot be obtained. From these facts, it is believed that when the acid-modified polyvinyl acetal resin is used, due to the acid group thereof, adhesion of the image-recording layer to a substrate is improved and as a result, the improvement in development latitude can be achieved, while maintaining the alkali-dissolving property.

According to the present invention, owing to interaction between the aqueous alkali solution-soluble resin having phenolic hydroxy group, which is typified by a novolak resin, and the acid-modified polyvinyl acetal resin, solubility of the aqueous alkali solution-soluble resin is decreased in the image area, whereby the discrimination increases and also the development latitude is astoundingly improved. Since the addition of compound having a light absorption region (350 to 500 nm) in a visible range, for example, an onium salt or a quinonediazide compound is not essential, the lithographic printing plate precursor of the present invention can be handled under a white light. Thus, the inconvenience in that a place for handling a lithographic printing plate precursor is restricted to a place illuminated with a yellow light is eliminated. Further, owing to the formation of crosslinked film in the surface region of image-recording layer, the solvent resistance of printing plate is remarkably increased and it becomes possible to use a cleaner solution on the printing plate and ink containing a specific solvent, for example, UV ink. Therefore, the problems included in the prior art described above can be totally resolved.

As described above, the printing plate precursor containing a polymer having an ortho carboxylic acid graft chain or the like and a photo-acid generator is disclosed in JP-A-10-87733. On the contrary, by controlling a pKa value of an acid group included in the acid-modified polyvinyl acetal resin to not more than 5 according to the present invention, the excellent discrimination effect can be achieved without the presence of a photo-acid generator. Thus, a lithographic printing plate precursor having excellent properties, which utilizes a light-heat conversion action, can be obtained.

Embodiments of the present invention will be described in more detail below.

<Acid-Modified Polyvinyl Acetal Resin>

The acid-modified polyvinyl acetal resin for use in the present invention is a polyvinyl acetal resin including an acid group having a pKa (acid dissociation constant) of not more than 5. The resin is ordinarily obtained by introducing an acid having a pKa of not more than 5 into a polyvinyl acetal resin for the modification. The acid-modified polyvinyl acetal resin is a resin soluble or swellable in an aqueous alkali solution. An amount of the acid group introduced in the acid-modified polyvinyl acetal resin is ordinarily in a rage of from 0.1 to 6 milliequivalent in terms of acid content per g of the resin. When the acid content per g of the resin is less than 0.1 milliequivalent, the developing property in an alkali developer becomes insufficient. On the other hand, when the acid content per g of the resin is more than 6 milliequivalent, the abrasion resistance tends to deteriorate. The acid content per g of the resin is preferably from 0.5 to 4 milliequivalent.

Specific examples of the acid-modified polyvinyl acetal resin include those obtained by reacting polyvinyl acetal resins as described in JP-A-61-267042, JP-A-61-281236 and JP-A-62-58242 with an intramolecular acid anhydride of organic polycarboxylic acid and those obtained by introducing a component containing a hydroxy group or a cyano group into these resins. Particularly preferred acid-modified polyvinyl acetal resins are those represented by the following formula (I):

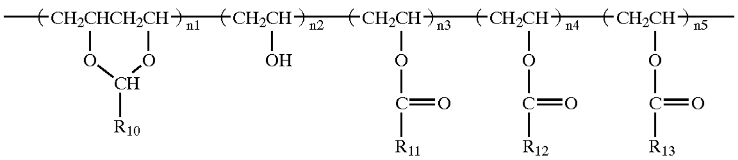

wherein $R_{10}$ represents an alkyl group which may have a substituent or a hydrogen atom; $R_{11}$ represents an unsubstituted alkyl group; $R_{12}$ represents an aliphatic or aromatic hydrocarbon group having a carboxylic acid group; $R_{13}$ represents an aliphatic or aromatic hydrocarbon group having at least one group selected from a hydroxy group and a cyano group, which may have other substituent; $n_1$, $n_2$, $n_3$, $n_4$ and $n_5$ each represent a mol % of each repeating unit in the following range; $n_1$=5 to 85, $n_2$=0 to 60, $n_3$=0 to 20, $n_4$=3 to 60 and $n_5$=0 to 60.

The resin represented by formula (I) described above can be obtained by acetalation of polyvinyl alcohol with an aldehyde, reacting the remaining hydroxy group with an acid anhydride and then reacting a part of the resulting carboxylic acid group with a halogen compound having a hydroxy group or a cyano group. The resin represented by formula (I) preferably comprises 5 components including as a first component a vinyl acetal component, as a second component a vinyl alcohol component, as a third component an unsubstituted ester component, as a fourth component an ester component having a carboxy group, and as a fifth component an ester component having a hydroxy group or a cyano group. The respective components may contain one or more structural units.

The vinyl acetal component as the first component is a component obtained by reacting a vinyl alcohol component with an aliphatic aldehyde which may have a substituent. Examples of the substituent for the aliphatic aldehyde include a carboxy group, a hydroxy group, a chlorine atom, a bromine atom, a tert-amino group, an alkoxy group, a cyano group, a nitro group, an amido group, an ester group, a urethane group and a ureido group. Specific examples of the aliphatic aldehyde used include formaldehyde, acetaldehyde, propionaldehyde, butylaldehyde, pentylaldehyde, hexylaldehyde, glyoxylic acid, N,N-dimethylformamidodi-n-butylacetal, bromacetaldehyde, chloracetaldehyde, 3-hydroxy-n-butylaldehyde, 3-methoxy-n-butylaldehyde, 3-(dimethylamino)-2,2-dimethylpropionaldehyde and cyanoacetaldehyde, but the aliphatic aldehyde used should not be construed as being limited thereto.

In the unsubstituted ester component as the third component, $R_{11}$ preferably represents an alkyl group having from 1 to 12 carbon atoms. Particularly, a methyl group and an ethyl group are preferred in view of the developing property.

In the ester component having a carboxy group as the forth component, $R_{12}$ preferably represents an aliphatic carboxylic acid moiety having from 1 to 20 carbon atoms or an aromatic carboxylic acid residue. The ester component having a carboxy group is mainly obtained by reacting the remaining hydroxy group of polyvinyl acetal with an acid anhydride, for example, succinic anhydride, maleic anhydride, phthalic anhydride, tetrahydrophthalic anhydride, trimellitic anhydride, 1,2-cyclohexanedicarboxylic anhydride and cis-4-cyclohexene-1,2-dicarboxylic anhydride. Other cyclic acid anhydrides may be used. Of the acid anhydrides, 1,2-cyclohexanedicarboxylic anhydride, tetrahydrophthalic anhydride, phthalic anhydride and trimellitic anhydride are preferably used. The group represented by $R_{12}$ may further have a substituent other than a carboxy group. Examples of the substituent include a hydroxy group, a cyano group, a chlorine atom, a bromine atom, a nitro group, and a group represented by any one of the following formulas:

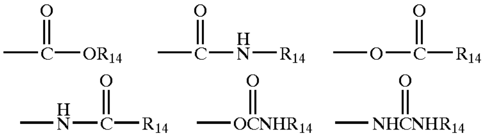

and $—OR_{14}$ wherein $R_{14}$ represents an alkyl group having from 1 to 20 carbon atoms which may have a substituent, an aralkyl group which may have a substituent or an aryl group which may have a substituent, and the substituent includes, for example, a hydroxy group, a cyano group, a chlorine atom, a bromine atom and a nitro group.

In the ester component having a hydroxy group or a cyano group as the fifth component, the group represented by $R_{13}$ is obtained by reacting the carboxylic acid group included in the group represented by $R_{12}$ of the fourth component with a halogen compound having a hydroxy group or a cyano group to conduct esterification. Specific examples of the group represented by $R_{13}$ are set forth below, but the group should not be construed as being limited thereto.

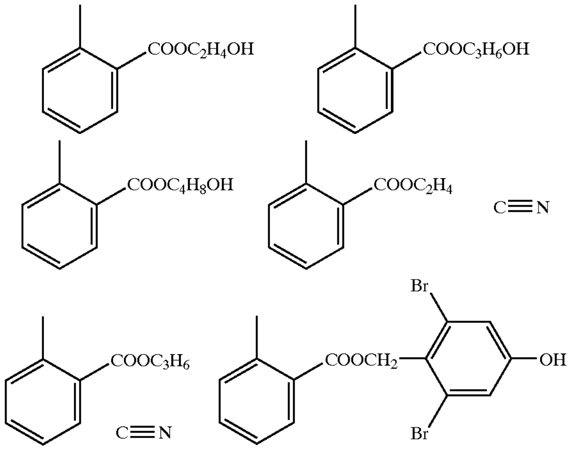

-continued
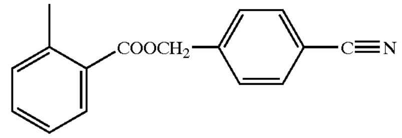
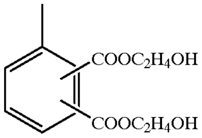
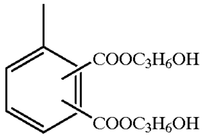
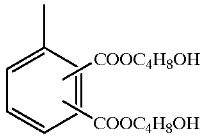
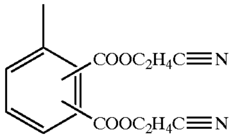
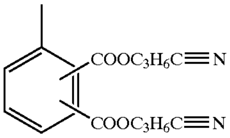
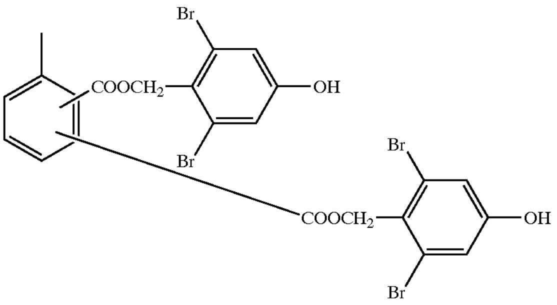
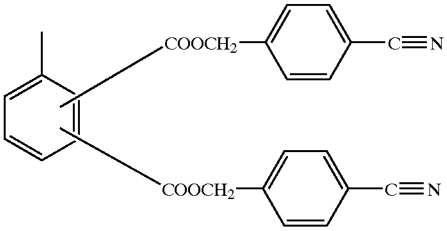
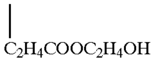
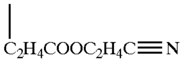
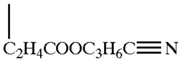
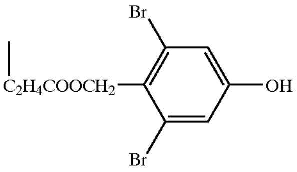
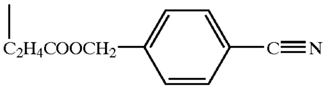
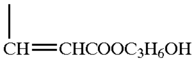
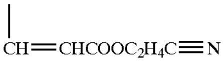
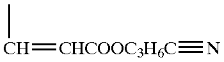
-continued
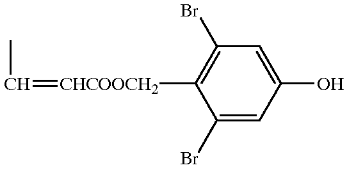
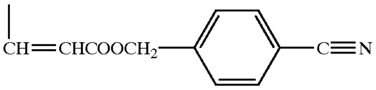
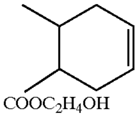
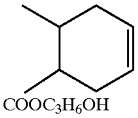
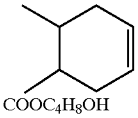
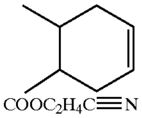
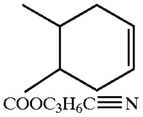
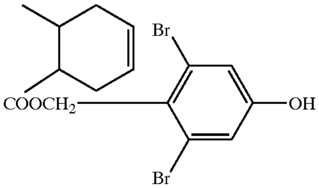
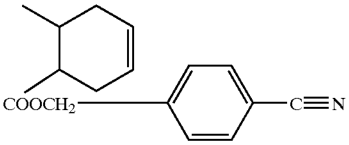
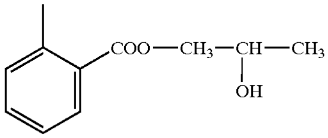
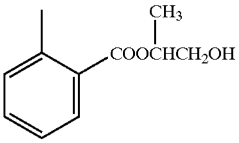
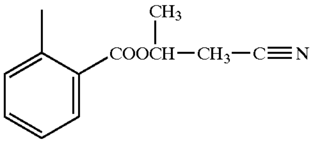
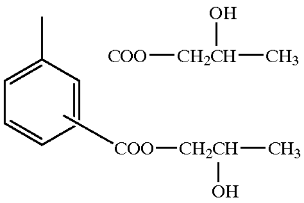
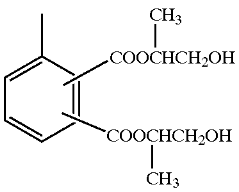
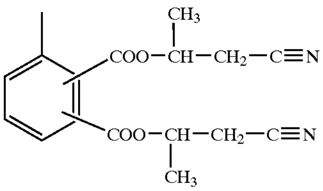
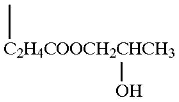
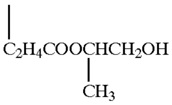
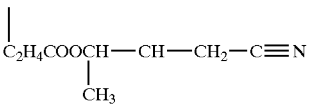
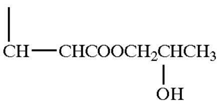

-continued

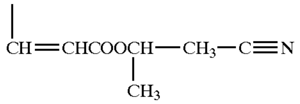

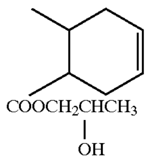

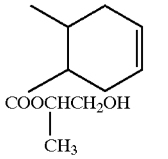

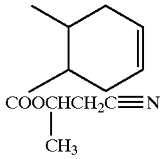

In the acid-modified polyvinyl acetal resin represented by formula (I) described above, the value of $n_1$ is preferably from 5 to 85 mol %, and particularly preferably from 25 to 70 mol %. As the value of $n_1$ becomes smaller, the film strength becomes weaker. On the other hand, when the value of $n_1$ becomes too large, the content of other components eventually decreases to cause undesirable effects.

The value of $n_4$ is preferably from 3 to 60 mol %, and particularly preferably from 10 to 55 mol %. AS the value of $n_4$ becomes larger, swelling of the exposed area in an alkali developer becomes larger. On the other hand, when the value of $n_4$ becomes smaller, development with an alkali developer becomes difficult to occur removal of the coating layer during the development.

The value of $n_5$ is preferably from 0 to 60 mol %, and particularly preferably from 0 to 40 mol %. When the value of $n_5$ becomes too large, the content of other components eventually decreases to cause undesirable effects.

A weight average molecular weight of the acid-modified polyvinyl acetal resin, which is measured by gel permeation chromatography, is suitably from about 5,000 to about 400,000, and preferably from about 50,000 to about 300,000.

The acid-modified polyvinyl acetal resins may be used individually or as a mixture of two or more thereof. In the present invention, the acid-modified polyvinyl acetal resin may also be used in combination with other resins in an amount of not more than 50% by weight based on the acid-modified polyvinyl acetal resin, if desired. Examples of such other resins mixable include a polyurethane resin having no carboxy group, a polyvinyl acetal resin which does not modified with an acid, a polyamide resin, an epoxy resin, an acrylic resin, a methacrylic resin, a polystyrene resin and a novolak phenol resin.

The acid-modified polyvinyl acetal resin is used ordinarily from 0.5 to 20% by weight, preferably from 1.0 to 10% by weight, based on the total solid content of the image-recording layer.

<Aqueous Alkali Solution-Soluble Resin Having Phenolic Hydroxy Group>

The aqueous alkali solution-soluble resin having phenolic hydroxy group (hereinafter also referred to as a "resin having phenolic hydroxy group") for use in the present invention include, for example, a novolak resin, e.g., phenolformaldehyde resin, m-cresolformaldehyde resin, p-cresolformaldehyde resin, m-/p-mixed cresolformaldehyde resin and phenol/cresol (the cresol may be any one of m-cresol, p-cresol and m-/p-mixed cresol) mixed formaldehyde resin.

Of the resins having phenolic hydroxy group, those having a weight average molecular weight of from 500 to 20,000 and a number average molecular weight of from 200 to 10,000 are preferred. Also, a condensation product of a phenol containing as a substituent, an alkyl group having from 3 to 8 carbon atoms with formaldehyde, for example, tert-butylphenolformaldehyde resin or octylphenolformaldehyde resin as described in U.S. Pat. No. 4,123,279 may be used. The resins having phenolic hydroxy group may be used individually or as a mixture of two or more thereof.

According to one embodiment of the present invention, a copolymer containing as a copolymerization component, at least one monomer selected from monomers (a) to (c) described below in an amount of not less than 10% by mole (hereinafter also referred to as a "specific copolymer") may be used together with the acid-modified polyvinyl acetal resin and the resin having phenolic hydroxy group as typified by the novolak resin. The specific copolymer exhibits a function of enhancing dissolution speed in the non-image area to increase the discriminating development effect without accelerating dissolution in the image area, when it is used together with the acid-modified polyvinyl acetal resin. It is presumed that the function is caused by the structural feature of having a phenol group or both a sulfone group and an imido group, and such a preferable effect is not recognized in other solvent-soluble binder polymers ordinarily used.

(a) A monomer having a sulfonamido group, in which at least one hydrogen atom is bonded to the nitrogen atom, per molecule, (b) A monomer having an active imino group represented by the formula shown below, per molecule,

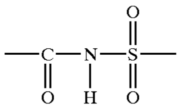

(c) A monomer selected from an acrylamide, a methacrylamide, an acrylic ester and a methacrylic ester each containing a phenolic hydroxy group, and a hydroxystyrene.

The specific copolymer for use in the present invention must contain as a copolymerization component, at least one monomer selected from monomers (a) to (c) described above in an amount of not less than 10% by mole. The content of monomers (a) to (c) is preferably not less than 20% by mole. When a copolymer having the content of monomers (a) to (c) of less than 10% by mole is used, the interaction thereof with the resin having phenolic hydroxy group is insufficient and as a result, the development latitude may be degraded The specific polymer may contain copolymerization components other than the monomers (a) to (c).

The monomer of (a) is a monomer of a low molecular compound having at least one sulfonamido group, in which at least one hydrogen atom is bonded onto the nitrogen atom, and at least one polymerizable unsaturated bond, per molecule. Of the monomers, low molecular compounds having both a group selected from an acryloyl group, an allyl group and vinyloxy group and a group selected from an unsubstituted or mono-substituted aminosulfonyl group and a substituted sulfonylimino group are preferred.

Such low molecular compounds include, for example, compounds represented by the following formulas (II) to (II)

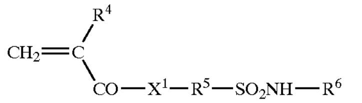

(III)

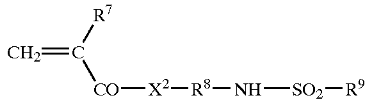

(IV)

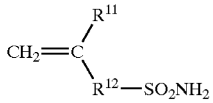

(V)

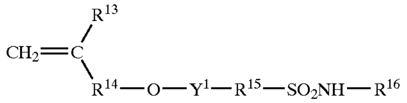

(VI)

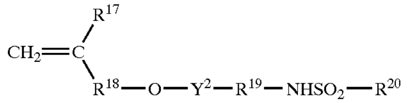

wherein $X^1$ and $X^2$ each represent —O— or —$NR^{10}$—; $R^4$ and $R^7$ each represent a hydrogen atom or a methyl group; $R_5$, $R^8$, $R^{12}$, $R^{15}$ and $R^{19}$ each represent an alkylene group having from 1 to 12 carbon atoms, which may have a substituent, a cycloalkylene group having up to 12 carbon atoms, which may have a substituent, an arylene group having up to 12 carbon atoms, which may have a substituent or an aralkylene group having up to 12 carbon atoms, which may have a substituent; $R^6$, $R^{10}$ and $R^{16}$ each represent an alkyl group having from 1 to 12 carbon atoms, which may have a substituent, a cycloalkyl group having up to 12 carbon atoms, which may have a substituent, an aryl group having up to 12 carbon atoms, which may have a substituent or an aralkyl group having up to 12 carbon atoms, which may have a substituent; $R^9$ and $R^{20}$ each represent an alkyl group having from 1 to 12 carbon atoms, which may have a substituent, a cycloalkyl group having up to 12 carbon atoms, which may have a substituent, an aryl group having up to 12 carbon atoms, which may have a substituent or an aralkyl group having up to 12 carbon atoms, which may have a substituent; $R^{11}$, $R^{13}$ and $R^{17}$ each represent a hydrogen atom or a methyl group; $R^{14}$ and $R^{18}$ each represent a single bond or an alkylene group having from 1 to 12 carbon atoms, which may have a substituent, a cycloalkylene group having up to 12 carbon atoms, which may have a substituent, an arylene group having up to 12 carbon atoms, which may have a substituent or an aralkylene group having up to 12 carbon atoms, which may have a substituent; and $Y^1$ and $Y^2$ each represent a single bond or —CO—.

Specific examples of such a compound, which can be suitably used, include m-aminosulfonylphenyl methacrylate, N-(p-aminosulfonylphenyl)methacrylamide and N-(p-aminosulfonylphenyl)acrylamide.

The monomer of (b) is a monomer of a low molecular compound having at least one active imino group represented by the above-described formula and at least one polymerizable unsaturated bond, per molecule. Specific examples of such a compound, which can be suitably used, include N-(p-toluenesulfonyl)methacrylamide and N-(p-toluenesulfonyl)acrylamide.

The monomer of (c) is a monomer selected from an acrylamide, a methacrylamide, an acrylic ester and a methacrylic ester each containing a phenolic hydroxy group, and a hydroxystyrene. Specific examples of such a compound, which can be suitably used, include N-(4-hydroxyphenyl) acrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene and p-hydroxystyrene.

The copolymerization components other than the monomers (a) to (c), which can be used, include monomers set forth in the following items (1) to (12):

(1) Acrylic acid ester or methacrylic acid ester having an aliphatic hydroxyl group, for example, 2-hydroxyethyl acrylate or 2-hydroxyethyl methacrylate.

(2) Alkyl acrylate, for example, methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate or N-dimethylaminoethyl acrylate.

(3) Alkyl methacrylate, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate or N-dimethylaminoethyl methacrylate.

(4) Acrylamide or methacrylamide, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(5) Vinyl ether, for example, ethyl vinyl ether, 2-chloroethyl vinyl ether, hydroxyethyl vinyl ether, propyl vinyl ether, butyl vinyl ether, octyl vinyl ether or phenyl vinyl ether.

(6) Vinyl ester, for example, vinyl acetate, vinyl chloroacetate, vinyl butyrate or vinyl benzoate.

(7) Styrene, for example, styrene, α-methylstyrene, methyl styrene or chloromethylstyrene.

(8) Vinyl ketone, for example, methyl vinyl ketone, ethyl vinyl ketone, propyl vinyl ketone or phenyl vinyl ketone.

(9) Olefin, for example, ethylene, propylene, isobutylene, butadiene or isoprene.

(10) N-vinylpyrrolidone, N-vinylcarbazole, 4-vinylpyridine, acrylonitrile or methacrylonitrile.

(11) Unsaturated imide, for example, maleimide, N-acryloylacrylamide, N-acetylmethacrylamide, N-propionylmethacrylamide or N-(p-chlorobenzoyl) methacrylamide.

(12) Unsaturated carboxylic acid, for example, acrylic acid, methacrylic acid, maleic anhydride or itaconic acid.

The specific copolymer for use in the present invention preferably has a weight average molecular weight of not less than 2,000 and a number average molecular weight of not less than 1,000. The specific copolymers having the weight average molecular weight of from 5,000 to 300,000, the number average molecular weight of from 2,000 to 250,000 and dispersity (weight average molecular weight/number average molecular weight) of from 1.1 to 10 are more preferred.

The specific copolymers may be used individually or as a combination of two or more thereof. A weight ratio of the above-described resin having phenolic hydroxy group to the above-described specific copolymer is preferably in a range of from 50/50 to 5/95, and more preferably in a range of from 40/60 to 10/90. When the amount of the resin having phenolic hydroxy group is larger than the above-described ratio, the sea-island structure is reversed and the improvements in solvent resistance and other properties may become difficult. On the other hand, when the amount of the specific copolymer is larger than the above-described ratio, the surface layer composed of the resin having phenolic hydroxy group becomes too thin and thus, the improvement in development latitude becomes insufficient.

The total amount of the resin having phenolic hydroxy group and the specific copolymer, which may be optionally used, is ordinarily from 30 to 99% by weight, preferably from 40 to 95% by weight, and particularly preferably from 50 to 90% by weight based on the total solid content of the image-recording layer. When the amount added is less than 30% by weight, the durability of the image-recording layer is deteriorated, and on the other hand, the amount added exceeding 99% by weight is undesirable in both the sensitivity and the durability.

<Substance that Absorbs Light to Generate Heat>

Various pigments and dyes are used as the substance that absorbs light to generate heat in the present invention. The pigments, which can be utilized, include commercially available pigments and pigments described, for example, in *Colour Index* (C.I.), *Saishin Ganryo Binran* (*Latest Pigment Handbook*), edited by Nippon Ganryo Gijutu Kyokai (1977), *Saishin Ganryo Oyo Gijutu* (*Latest Pigment Application Techniques*), CMC Publishing (1986) and *Insatu-inki Gijutu* (*Printing Ink Techniques*), CMC Publishing (1984).

The pigments include black pigments, yellow pigments, orange pigments, brown pigments, red pigments, violet pigments, blue pigments, green pigments, fluorescent pigments, metal powder pigments and polymer-bonding pigments. Specifically, insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, Reichardt's dyes, azine pigments, nitroso pigments, nitro pigments, natural pigments, fluorescent pigments, inorganic pigments and carbon black can be used.

The pigment may be used with or without being subjected to a surface treatment. Methods for the surface treatment include a method of coating a surface of pigment with a resin or wax, a method of adhering a surface active agent to a surface of pigment, a method of bonding a reactive substance (e.g., a silane coupling agent, an epoxy compound or polyisocyanate) to a surface of pigment. The methods for surface treatment are described, for example, in *Kinzokusekken no Seishitu to Oyo* (*Properties and Applications of Metal Soap*), published by Saiwai Shobo, *Insatu-inki Gijutu* (*Printing Ink Techniques*), CMC Publishing (1984) and *Saishin Ganryo Oyo Gijutu* (*Latest Pigment Application Techniques*), CMC Publishing (1986).

A particle size of the pigment is preferably in a range of from 0.01 μm to 10 μm, more preferably in a range of from 0.05 μm to 1 μm, and particularly preferably in a range of from 0.1 μm to 1 μm. The pigment having a particle size of less than 0.01 μm is not preferred in view of stability of the pigment dispersion in a coating solution for the image-recording layer. On the other hand, the pigment having a particle size of more than 10 μm is not preferred in view of uniformity of the image-recording layer. In order to disperse the pigment, known dispersion techniques used for the production of ink or toner can be used. Examples of the dispersing apparatus include an ultrasonic disperser, a sand mill, an attriter, a pearl mill, a super mill, a ball mill, an impeller, a disperser, a KD mill, a colloid mill, a Dynatron, a tree-rod roll mill and a pressure kneader. The dispersing apparatus are described, for example, in *Saishin Ganryo Oyo Gijutu* (*Latest Pigment Application Techniques*), CMC Publishing (1986).

The dye, which can be utilized, include commercially available dyes and known dyes described in literatures, for example, *Senryo Binran* (*Handbook of Dyes*), edited by Yuki Gosei Kagaku Kyokai (1970). Specific examples of the dye include azo dyes, metal complex salt azo dyes, pyrazolone azo dyes, anthraquinone dyes, phthalocyanine dyes, carbonium dyes, quinoneimine dyes, methine dyes and cyanine dyes. In the present invention, among the pigments and dyes, those absorbing infrared ray or near infrared ray are particularly preferred from the perspective that they are suitable for using a laser emitting infrared ray or near infrared ray.

As the pigment absorbing infrared ray or near infrared ray, carbon black is preferably used. Examples of the dye absorbing infrared ray or near infrared ray include cyanine dyes described, for example, in JP-A-58-125246, JP-A-59-84356, JP-A-59-202829 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described in British Patent 434,875.

Near infrared absorbing sensitizers described in U.S. Pat. No. 5,156,938 are also preferably used as the dyes. Further, compounds, for example, substituted arylbenzo(thio) pyrylium salts described in U.S. Pat. No. 3,881,924, trimethinethiapyrylium salts described in JP-A-57-142645 (U.S. Pat. No. 4,327,169), the pyrylium-based compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds described in JP-B-5-13514 and JP-B-5-19702 (the term "JP-B" as used herein means an "examined Japanese patent publication"), Epolight III-178, Epolight III-130 and Epolight III-125 are particularly preferably used.

Other particularly preferred examples of the dye include near infrared absorbing dyes represented by formulae (I) and (II) described in U.S. Pat. No. 4,756,993.

The pigment or dye is added to the lithographic printing plate precursor in an amount of from 0.01 to 50% by weight, preferably from 0.1 to 10% by weight, and particularly preferably from 0.5 to 10% by weight in case of the dye or from 3.1 to 10% by weight in case of the pigment, based on the total solid content of the image-recording layer. When the amount of pigment or dye added is less than 0.01% by weight, the sensitivity tends to decrease. On the other hand, when the amount of pigment or dye added exceeds 50% by weight, the uniformity of image-recording layer decreases and the durability of image-recording layer is deteriorated. The dye or pigment may be added together with other components to the same layer or another layer provided separately. When the other layer is provided, it is desired that the dye or pigment, the resin having phenolic hydroxy group and the acid-modified polyvinyl acetal resin are present in the same layer.

<Other Components>

In the formation of the positive working image-recording layer, various additives can be added, if desired, in addition of the above-described essential components, as far as the effects of the present invention are not diminished.

For instance, the use of a substance that is heat-decomposable and substantially decreases solubility of the aqueous alkali solution-soluble resin in the undecomposed state, for example, an onium salt, an o-quinonediazide compound, an aromatic sulfone compound or an aromatic sulfonic acid ester compound, together with the above-described components is preferred for the purpose of improving the dissolution inhibiting property of image areas in a developer. Examples of the onium salt include a diazonium salt, an ammonium salt, a phosphonium salt, an iodonium salt, a sulfonium salt, a selenonium salt and an arsonium salt.

Preferred examples of the onium salt for use in the present invention include diazonium salts described in S. I. Schlesinger, *Photogr. Sci. Eng*., 18, 387 (1974), T. S. Bal et al., *Polymer*, 21, 423 (1980) and JP-A-5-158230, ammonium salts described in U.S. Pat. Nos. 4,069,055 and 4,069,056 and JP-A-3-140140, phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988) and U.S. Pat. Nos. 4,069,055 and 4,069,056, iodonium salts described in J. V. Crivello et al., *Macromolecules*, 10 (6), 1307 (1977), *Chem. & Eng. News*, Nov. 28, p. 31 (1988), European Patent 104,143, U.S. Pat. Nos. 339,049 and 410,201, JP-A-2-150848 and JP-A-2-296514, sulfonium salts described in J. V. Crivello et al., *Polymer J*., 17, 73 (1985), J. V. Crivello et al., *J. Org. Chem*., 43, 3055 (1978), W. R. Watt et al., *J. Polymer Sci., Polymer Chem. Ed*., 22, 1789 (1984), J. V. Crivello et al., *Polymer Bull*., 14, 279 (1985), J. V. Crivello et al., *Macromolecules*, 14 (5), 1141 (1981), J. V. Crivello et al., *J. Polymer Sci., Polymer Chem. Ed*., 17, 2877 (1979), European Patents 370,693, 233,567, 297,443 and 297,442, U.S. Pat. Nos. 4,933,377, 3,902,114, 410,201, 339,049, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed*., 17, 1047 (1979), and arsonium salts described in C. S. Wen et al., *Teh, Proc. Conf. Rad. Curing ASIA*, p. 478, Tokyo, October (1988).

Of the onium salts, the diazonium salt is particularly preferred. Particularly preferred examples of the diazonium salt include those described in JP-A-5-158230.

Examples of counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and para-toluenesulfonic acid. Of these compounds, hexafluorophosphoric acid and an alkylaromatic sulfonic acid, for example, triisopropylnaphthalenesulfonic acid or 2,5-dimethylbenzenesulfonic acid are particularly preferred.

Preferred examples of the quinonediazide include o-quinonediazide compounds. The o-quinonediazide compound for use in the present invention is a compound, which has at least one o-quinonediazido group and increases the alkali solubility upon thermal decomposition, and compounds having various structures can be used. Specifically, the o-quinonediazide compound assists the dissolution of the photosensitive system by the two functions in that the o-quinonediazide compound loses the capability of inhibiting dissolution of the binder upon thermal decomposition and the o-quinonediazide compound itself changes into an alkali-soluble substance. Examples of the o-quinonediazide compound, which can be used in the present invention, include compounds described in J. Kosar, *Light-Sensitive Systems*, pp. 339–352, John Wiley & Sons, Inc. In particular, sulfonic acid esters or sulfonic acid amides of o-quinonediazide, which are obtained by reacting with various aromatic polyhydroxy compounds or aromatic amino compounds, are preferred. Also, ester of benzoquinone-(1,2)-diazidosulfonic chloride or naphthoquinone-(1,2)-diazido-5-sulfonic chloride with a pyrogallol-acetone resin described in JP-B-43-28403 and ester of benzoquinone-(1,2)-diazidosulfonic chloride or naphthoquinone-(1,2)-diazido-5-sulfonic chloride with a phenol-formaldehyde resin described in U.S. Pat. Nos. 3,046,120 and 3,188,210 are preferably used.

Further, ester of naphthoquinone-(1,2)-diazido-4-sulfonic chloride with a phenol-formaldehyde resin or cresol-formaldehyde resin and ester of naphthoquinone-(1,2)-diazido-4-sulfonic chloride with a pyrogallol-acetone resin are also preferably used. Other useful o-quinonediazide compounds are described in a great number of patents. For example, those described in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890 can be used.

An amount of the substance that is heat-decomposable and substantially decreases solubility of the aqueous alkali solution-soluble resin in the undecomposed state added is preferably from 1 to 50% by weight, more preferably from 5 to 30% by weight, and particularly preferably from 10 to 30% by weight, based on the total solid content of the image-recording layer. The compounds may be used individually or as a mixture of two or more thereof.

For the purpose of further increasing the sensitivity, a cyclic acid anhydride, a phenol or an organic acid may also be used together. Examples of the cyclic acid anhydride include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Examples of the organic acid include a sulfonic acid, a sulfinic acid, an alkylsulfuric acid, a phosphonic acid, a phosphoric acid ester and a carboxylic acid described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. A content of the cyclic acid anhydride, phenol or organic acid is preferably from 0.05 to 20% by weight, more preferably from 0.1 to 15% by weight, and particularly preferably from 0.1 to 10% by weight, based on the total solid content of the image-recording layer.

In order to increase the stability of processing against fluctuation of development conditions, a nonionic surface active agent as described in JP-A-62-251740 and JP-A-3-208514, an amphoteric surface active agent as described in JP-A-59-121044 and JP-A-4-13149, a siloxane compound as described in European Patent 950,517 and a copolymer of fluorine-containing monomer as described in JP-A-11-288093 may be added to a coating solution for the image-recording layer according to the present invention.

Specific examples of the nonionic surface active agent include sorbitan tristearate, sorbitan monopalmitate, sorbitan trioleate, stearic acid monoglyceride and polyoxyethylene nonyl phenyl ether. Specific examples of the amphoteric surface active agent include alkyldi(amonoethyl)glycine, alkylpolyaminoethylglycine hydrochloride, 2-alkyl-N-carboxyethyl-N-hydroxyethylimidazolinium betaine and an N-tetradecyl-N,N-betaine type surface active agent (e.g., Amorgen K manufactured by Dai-ichi Kogyo Seiyaku Co., Ltd.).

As the siloxane compound, a block copolymer of dimethylsiloxane and polyalkylene oxide is preferred. Specific examples thereof include polyalkylene oxide-modified silicone, e.g., DBE-224, DBE-621, DBE-712, DBP-732 and DBP-534 manufactured by Chisso Corp., and Tego Glide 100 manufactured by Tego A. G. in Germany.

The content of the nonionic surface active agent, amphoteric surface active agent or siloxane compound is preferably from 0.05 to 15% by weight, more preferably from 0.1 to 5% by weight, based on the total solid content of the image-recording layer.

To the image-recording layer for use in the present invention, a printing-out agent for obtaining a visible image immediately after heating upon exposure, or a dye or pigment serving as a coloring agent for image may be added.

A representative example of the printing-out agent includes a combination of a compound capable of releasing an acid by heating upon exposure (photo-acid releasing agent) and an organic dye capable of forming a salt. Specific examples thereof include combinations of o-naphthoquinonediazido-4-sulfonic acid halogenide and salt-forming organic dye described in JP-A-50-36209 and JP-A-53-8128 and combinations of trihalomethyl compound and salt-forming organic dye described in JP-A-53-36223, JP-A-54-74728, JP-A-60-3626, JP-A-61-143748, JP-A-61-151644 and JP-A-63-58440. The trihalomethyl compound includes an oxazole compound and a triazine compound, and both compounds have excellent preservation stability and provide a clear print-out image.

As the coloring agent for image, in addition to the above-described salt-forming organic dyes, other dyes can be used. Preferred dyes include an oil-soluble dye and a basic dye including the salt-forming organic dye. Specific examples thereof include Oil Yellow #101, Oil Yellow #103, Oil Pink #312, Oil Green BG, Oil Blue BOS, Oil Blue #603, Oil Black BY, Oil Black BS and Oil Black T-505 (all manufactured by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000) and Methylene Blue (CI52015). Also, dyes described in JP-A-62-293247 are particularly preferred. The dye may be added to the image-recording layer in an amount of from 0.01 to 10% by weight, and preferably from 0.1 to 3% by weight, based on the total solid content of the image-recording layer.

Further, to the image-recording layer of the present invention, a plasticizer is added, for example, in order to impart flexibility of a coated film, if desired. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer or polymer of acrylic acid or methacrylic acid.

The image-recording layer of lithographic printing plate precursor according to the present invention can be produced by dissolving the above-described components in a solvent to form a coating solution for image-recording layer and coating the coating solution for image-recording layer on an appropriate support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, however, the solvent for use in the present invention should not be construes as being limited thereto. The solvents may be used individually or as a mixture thereof.

With respect to the selection of coating solvent in a case wherein the image-recording layer has a two-layer structure composed of an upper recording layer and a lower recording layer, it is preferred to select a coating solvent for the upper recording layer, which does not substantially dissolve the lower recording layer, in order to prevent the dissolution at the interface between the adjacent respective layers.

The concentration of the above-described components (total solid content including additives) in the solvent is preferably from 1 to 50% by weight.

As the method of coating, various methods, for example, bar coater coating, rotary coating, spray coating, curtain coating, dip coating, air-knife coating, blade coating or roll coating can be used.

As the coated amount is smaller, the apparent sensitivity becomes higher but the film characteristics of the image-recording layer are degraded.

To the image-recording layer for use in the present invention is added a surface active agent for improving the coating property, for example, fluorine-containing surface active agent as described in JP-A-62-170950. The amount of the surface active agent is preferably from 0.01 to 1% by weight, and more preferably from 0.05 to 0.5% by weight, based on the total solid content of the image-recording layer.

<Support>

The support used for the lithographic printing plate precursor of the present invention is a dimensionally stable plate material having necessary strength and durability. Examples of the support include paper, paper laminated with plastic (for example, polyethylene, polypropylene or polystyrene), a metal plate (e.g., aluminum, zinc or copper plate), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film having laminated or deposited thereon a metal as described above.

The support for use in the present invention is preferably a polyester film or an aluminum plate. Among them, the aluminum plate is particularly preferred, since it is dimensionally stable and relatively inexpensive. The aluminum plate is preferably a pure aluminum plate or an alloy plate made of aluminum as the main component and containing a trace amount of foreign elements. A plastic film having laminated or deposited thereon aluminum may also be used. Examples of the foreign element contained in the aluminum alloy include silicon, iron, manganese, copper, magnesium, chromium, zinc, bismuth, nickel and titanium. The content of foreign element in the aluminum alloy is at most 10% by weight. In the present invention, particularly preferred aluminum is pure aluminum, but since perfectly pure aluminum is difficult to produce in view of refining technique, the aluminum may contain a slight amount of foreign element.

The aluminum plate for use in the present invention is not particularly limited regarding the composition thereof, and an aluminum plate, which has hitherto been known and commonly used, can be appropriately utilized. The thickness of aluminum plate for use in the present invention is approximately from 0.1 to 0.6 mm, preferably from 0.15 to 0.4 mm, and particularly preferably from 0.2 to 0.3 mm.

Prior to surface roughening treatment of an aluminum plate, a degreasing treatment using, for example, a surface active agent, an organic solvent or an aqueous alkaline solution is performed, if desired, in order to remove the rolling oil on the surface thereof. The surface roughening treatment of aluminum plate is performed by various methods, for example, a method of mechanically roughening the surface, a method of electrochemically dissolving and roughening the surface or a method of chemically dissolving selectively the surface. In the mechanically roughening method, a known method, for example, ball graining, brush graining, blast graining or buff graining may be used. The electrochemical surface roughening method includes a method of performing the treatment by applying an alternating current or direct current in an electrolytic solution containing hydrochloric acid or nitric acid. A method wherein the above-described two treatment methods are combined as described in JP-A-54-63902 may also be used. The aluminum plate thus roughened is subjected to an alkali etching treatment and a neutralization treatment, if desired, and then to an anodizing treatment in order to enhance the water retentivity or abrasion resistance of the surface, if desired. The electrolyte, which can be used in the anodizing treatment of the aluminum plate, includes various electrolytes capable of forming a porous oxide film, and sulfuric acid, phosphoric acid, oxalic acid, chromic acid or a mixed acid thereof is ordinarily used. The concentration of electrolyte is appropriately determined depending on the kind of electrolyte used.

The conditions of anodizing treatment may vary depending on the electrolyte used and thus, cannot be generally specified. However, suitable conditions are ordinarily such that the concentration of electrolyte is from 1 to 80 wt %, the liquid temperature is from 5 to 70° C., the current density is from 5 to 60 $A/dm^2$, the voltage is from 1 to 100 V, and the electrolysis time is from 10 seconds to 5 minutes. When the amount of anodized film is less than 1.0 $g/m^2$, the press life may be insufficient or the non-image area of lithographic printing plate is readily scratched to cause so-called "scratch toning", which is resulted from adhesion of ink to the scratched part at the printing. After the anodizing treatment, the surface of aluminum plate is subjected to a hydrophilization treatment, if desired. Examples of the hydrophilization treatment for use in the present invention include a method of using an alkali metal silicate (for example, an aqueous sodium silicate solution) described in U.S. Pat. Nos. 2,714,066, 3,181,461, 3,280,734 and 3,902,734. According to the method, the aluminum support is immersed or electrolyzed in an aqueous sodium silicate solution. Further, a method of treating the aluminum support with potassium fluorozirconate described in JP-B-36-22063 or with polyvinylphosphonic acid described in U.S. Pat. Nos. 3,276,868, 4,153,461 and 4,689,272 may be used.

The lithographic printing plate precursor of the present invention comprises the positive working image-recording layer as a single layer or a laminate structure of two or more layers on a support. An undercoat layer may be provided between the support and the image-recording layer (the lower image-recording layer in case of the laminate structure), if desired.

Various organic compounds are used as components of the undercoat layer and examples thereof include carboxymethyl cellulose, dextrin, gum Arabic, a polyacrylate, polyurethane or polyvinyl butyral having an alkali-soluble acid group, a phosphonic acid having an amino group, e.g., 2-aminoethylphosphonic acid, an organic phosphonic acid, e.g., phenylphosphonic acid, naphthylphosphonic acid, alkyl phosphonic acid, glycerophosphonic acid, methylenediphosphonic acid or ethylenediphosphonic acid, each of which may have a substituent, an organic phosphoric acid, e.g., phenylphosphoric acid, naphthylphosphoric acid, alkylphosphoric acid or glycerophosphoric acid, each of which may have a substituent, an organic phosphinic acid, e.g., phenylphosphinic acid, naphthylphosphinic acid, alkylphosphinic acid or glycerophosphinic acid, each of which may have a substituent, an amino acid, e.g., glycine or β-alanine, and hydrochloride of an amine having a hydroxy group, e.g., hydrochloride of triethanolamine. The compounds may be used as a mixture of two or more thereof.

In particular, the specific copolymer of monomer containing both a sulfone group and an imino group including representatively the compounds represented by formula (II) to (VI) as described above, which is incorporated into the image-recording layer is preferably used. The undercoat layer containing the specific polymer is preferred in view of the discrimination, although the undercoat layer itself does not substantially have the discrimination function of image area/non-image area. Two or more undercoat layers may be provided.

The organic undercoat layer can be provided according to the method described below. Specifically, there are a method of dissolving the above-described organic compound in water, an organic solvent, e.g., methanol, ethanol or methyl ethyl ketone, or a mixed solvent thereof, coating the resulting solution on an aluminum plate, followed by drying, and a method of dissolving the organic compound in water, an organic solvent, e.g., methanol, ethanol or methyl ethyl ketone, or a mixed solvent thereof, immersing an aluminum plate in the resulting solution to adsorb the organic compound, washing the aluminum plate, for example, with water, followed by drying. In the former method, a solution containing the organic compound at a concentration of 0.005 to 10% by weight can be coated by various methods. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 second to 20 minutes, preferably from 2 seconds to 1 minute. The solution used may be adjusted its PH to a range of from 1 to 12 with a basic substance, e.g., ammonia, triethylamine or potassium hydroxide or an acidic substance, e.g., hydrochloric acid or phosphoric acid.

The coverage of the organic undercoat layer is suitably from 2 to 200 $mg/m^2$, and preferably from 5 to 100 $mg/m^2$. When the coverage of the organic undercoat layer is less than 2 $mg/m^2$, sufficiently high printing durability cannot be obtained, and when it exceeds 200 $mg/m^2$, the same problem also occurs.

<Backcoat Layer>

A backcoat layer is provided on the rear surface of the support, if desired. As the backcoat layer, a coating layer of an organic polymer compound described in JP-A-5-45885 and a coating layer composed of a metal oxide obtained by hydrolysis and polymerization condensation of an organic or inorganic metal compound described in JP-A-6-35174 are preferably used. Of the coating layers, a coating layer composed of a metal oxide obtained from an alkoxy compound of silicon, for example, $Si(OCH_3)_4$, $Si(OC_2H_5)_4$, $Si(OC_3H_7)_4$ or $Si(OC_4H_9)_4$ is particularly preferred, since the alkoxy compound of silicon is cheaply available and the coating layer composed of a metal oxide obtained therefrom has excellent hydrophilicity.

<Plate-Making and Printing>

The lithographic printing plate precursor of the present invention is ordinarily subjected to a series of plate-making steps including, for example, imagewise exposure and development processing to prepare a lithographic printing plate, which is used for printing.

The image recording on the lithographic printing plate precursor is performed by using the function of heat. For instance, imagewise thermal recording is directly applied to the lithographic printing plate precursor using, for example, a thermal recording head. Light-heat conversion type exposure, for example, exposure using a solid laser or semiconductor laser emitting an infrared ray having a wavelength of from 760 to 1,200 nm, high-illuminance flash exposure, e.g., with a xenon discharge lamp or exposure with a infrared ray lamp can also be employed.

The recording of image may be conducted according to a whole image exposure method or a scanning exposure method. In the former case, an irradiation method with an infrared ray or a method of applying high-illuminance short-time exposure of a xenon discharge lamp to the lithographic printing plate precursor and generating heat by the light-heat conversion is employed. In the case of using a light source for whole image exposure, for example, an infrared ray lamp, while an exposure amount may vary depending on the illuminance thereof, it is usual that the exposure amount falls in such a range that the surface exposure intensity before modulation with image for printing is preferably from 0.1 to 10 J/cm$^2$, and more preferably from 0.1 to 1 J/cm$^2$. When the lithographic printing plate precursor has a transparent support, the exposure can also be carried out through the support from the backside of the support. It is desirable to select the exposure illuminance so that the above-described exposure intensity can be obtained by a period of exposure time of from 0.01 to 1 microsecond, and preferably from 0.01 to 0.1 microsecond. When the exposure time is long, it may be required to increase the exposure intensity because of competitive relationship between a generation rate of a thermal energy and a diffusion rate of the thermal energy generated.

In the latter case, a method of using a laser light source including a large amount of infrared ray component and scanning on the surface of lithographic printing plate precursor with the laser beam modulated by the image. Examples of the laser light source include a semiconductor laser a helium-neon laser, a helium-cadmium laser and a YAG laser. The lithographic printing plate precursor can be irradiated with a laser having a laser output of from 0.1 to 300 W. in case of using a pulse laser, it is preferred to irradiate a laser having a peak output of not less than 1,000 W, and preferably not less than 2,000 W. The exposure amount falls in such a range that the surface exposure intensity before modulation with image for printing is preferably from 0.1 to 10 J/cm$^2$, and more preferably from 0.3 to 1 J/cm$^2$. When the lithographic printing plate precursor has a transparent support, the exposure can also be carried out through the support from the backside of the support.

As a light source of active radiation for use in the image exposure, a light source having an emission wavelength in the region of from near infrared to infrared is preferred, and a solid laser or a semiconductor layer is more preferred. The emission wavelength is preferably from 760 to 1,080 nm.

As a developer and a replenisher used for the development processing of the positive working lithographic printing plate precursor for infrared laser suitable for direct plate-making according to the invention, an aqueous alkali solution, which is conventionally used for hereto known lithographic printing plate precursors, for example, PS plates, can be employed.

Examples of alkali agent, which can be used in a known aqueous alkali solution suitable for the lithographic printing plate precursor of the present invention, include an inorganic alkali salt, for example, sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide or lithium hydroxide. Also, an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can be used. The alkali agents may be used individually or in combination of two or more thereof.

Of the developers containing such an alkali agent, an aqueous solution of silicate, e.g., sodium silicate or potassium silicate is particularly preferred. The reason for this is that the developability can be adjusted by appropriately controlling the ratio between silicon oxide $SiO_2$ and alkali metal oxide $M_2O$ as components of the silicate and the concentration thereof. For example, the alkali metal silicates as described in Japanese Patent Laid-Open No. 62004/1979 and JP-A-54-62004 and JP-B-57-7427 (the term "JP-B" as used herein means an "examined Japanese patent publication") can be effectively used.

In the case of performing the development processing using an automatic developing machine, it is known that a large number of lithographic printing plate precursors can be processed without exchanging the developer in a development tank for a long period of time by adding an aqueous solution (replenisher) having alkalinity higher than the developer to the developer. In the present invention, such a replenishing system is also preferably used. In the developer and replenisher, various surface active agents and organic solvents may be added, if desired, for the purpose of accelerating or restraining the development, dispersing development scum or enhancing the ink-receptivity in the image area of the lithographic printing plate. Preferred examples of the surface active agent include an anionic surface active agent, a cationic surface active agent, a nonionic surface active agent and an amphoteric surface active agent. Further, the developer and replenisher may contain, if desired, a reducing agent, for example, hydroquinone, resorcin or sodium salt or potassium salt of an inorganic acid (e.g., sulfurous acid or hydrogen sulfurous acid), an organic carboxylic acid, a defoaming agent and a water softening agent.

After the development using the above-described developer and replenisher, the printing plate is subjected to an after-treatment with washing water, a rinsing solution containing, for example, a surface active agent or a desensitizing solution containing gum arabic or a starch derivative. These treatments can be used in various combinations for the after-treatment in the case of preparing a printing plate from the lithographic printing plate precursor of the present invention.

In recent years, an automatic developing machine for preparing a printing plate has been widely used in the plate-making and printing industries in order to rationalize and standardize the plate-making operation. In general, the automatic developing machine has a development part and an after-treatment part and comprises an apparatus for conveying a printing plate and tanks and spraying apparatus for respective processing solutions. In the development processing, each processing solution pumped up by a pump is sprayed through spray nozzles to the exposed printing plate precursor while horizontally conveying the printing plate precursor. Nowadays, a method of processing a printing plate precursor by conveying the printing plate precursor while immersing in processing solution tanks each filled with a processing solution the printing plate precursor by means of guide rollers in the processing solutions is also known. In such an automatic processing, the processing can be performed while replenishing each replenisher to each processing solution in response to the factors, for example, the amount of processing or the operating time. Moreover, a so-called disposable processing system wherein the processing is conducted using a substantially new processing solution can also be employed.

In the case where the lithographic printing plate obtained from the lithographic printing plate precursor of the present invention through the imagewise exposure, development, washing with water and/or rinsing and/or gumming has an unwanted image area (for example, an film edge mark of the original film), removal of the unwanted image area is carried out. Such removal is preferably performed by a method in which an removing solution is applied to the unwanted image area of printing plate, the printing plate is allowed to stand for a predetermined time and then washed with water, as described, for example, in JP-B-2-13293. However, a method where the unwanted image area is irradiated with an active radiation guided by an optical fiber and then subjected to development, as described in JP-A-59-174842 can also be employed.

The thus-obtained lithographic printing plate is coated with a desensitizing gum, if desired, and then can be used for printing. However, in the case where a lithographic printing plate having more improved printing durability is desired, the printing plate is subjected to a burning treatment. In the case of conducting the burning treatment of lithographic printing plate, prior to the burning treatment, the printing plate is preferably treated with a burning plate conditioner as described, for example, in JP-B-61-2518, JP-B-55-28062, JP-A-62-31859 and JP-A-61-159655.

The treatment may be performed by a method of applying the burning plate conditioner on the lithographic printing plate using a sponge or an absorbent cotton impregnated with the burning plate conditioner, a method of applying the burning plate conditioner by immersing the printing plate in a vat filled with the burning plate conditioner, or a method of applying the burning plate conditioner using an automatic coater. It can provide more preferred results that the amount applied is made uniform by a squeegee or a squeegee roller after the application.

An amount of the burning plate conditioner applied is ordinarily from 0.03 to 0.8 $g/m^2$ (dry weight). The lithographic printing plate provided with the burning plate conditioner is dried, if desired, and then heated at high temperature by a burning processor (for example, a burning processor "BP-1300" commercially available from Fuji Photo Film Co., Ltd.). The heating temperature and the heating time are preferably from 180 to 300° C. and from 1 to 20 minutes, respectively, although they may be varied depending on the components constituting the image.

After the burning treatment the lithographic printing plate can be subjected, if desired, to a conventionally known treatment, for example, washing wit water or gumming. However, in the case where a burning plate conditioner containing, for example, a water-soluble polymer compound is used, a so-called desensitizing treatment, for example, gumming can be omitted. The lithographic printing plate obtained through such treatments is mounted on an offset printing machine and used for printing of a large number of sheets.

The present invention is described in greater detail with reference to the following examples, but the present invention should not be construed as being limited thereto.

EXAMPLES 1 TO 7 AND COMPARATIVE EXAMPLES 1 TO 5

<Preparation of Support>

An aluminum plate (JIS 1050 material) having a thickness of 0.3 mm was degreased by cleaning with trichlorethylene, then grained the surface thereof using a nylon brush and an aqueous suspension of pumice stone of 400-mesh, and thoroughly washed with water. The aluminum plate was immersed in a 25% by weight aqueous solution of sodium hydroxide kept at 45° C. for 9 seconds to conduct etching, washed with water, immersed in a 20% by weight aqueous solution of nitric acid for 20 seconds, and again washed with water. The etching amount of the grained surface was about 3 $g/m^2$. Then, the aluminum plate was subjected to a direct-current anodizing treatment using a 7% by weight aqueous solution of sulfuric acid as an electrolyte under the condition of a current density of 15 $A/dm^2$ to form an anodic oxide film of 3 $g/m^2$ on the surface thereof, followed by washing and drying. Further, the aluminum plate was treated with a 2.5% by weight aqueous solution of sodium silicate at 30° C. for 10 seconds, and a coating solution for undercoat layer shown below was coated on the surface thereof and dried at 80° C. for 15 seconds, thereby preparing a support. The coverage of the undercoat layer after drying was 15 $mg/m^2$.

| Coating Solution for Undercoat Layer: | |
|---|---|
| Compound shown below | 0.3 g |
| Methanol | 100 g |
| Water | 1 g |
| 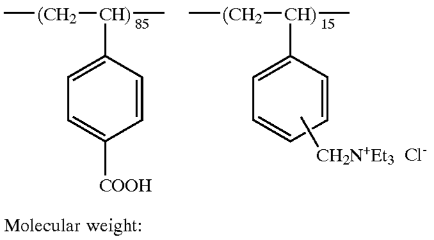 | |
| Molecular weight: | $2.8 \times 10^4$ |

<Formation of Image-Recording Layer A>

A coating solution for image-recording layer shown below was coated on the support described above so as to have a coverage of 1.60 $g/m^2$, and dried at 150° C. for 50 seconds using PERFECT OVEN PH 200 (manufactured by TABAI CO.) with setting Wind Control to 7 to prepare a lithographic printing plate precursor. The lithographic printing plate precursor just after the preparation was packed in an ordinary manner, allowed to stand at ambient temperature for one week, and then subjected to evaluation.

| Coating Solution for Image-Recording Layer 1 | |
|---|---|
| Methyl ethyl ketone | 20.204 g |
| m,p-Cresol novolak (m/p ratio = 6/4; weight average molecular weight: 7,000; manufactured by Sumitomo Durez Co., Ltd.) | 2.139 g |
| Tetrahydrophthalic anhydride | 0.100 g |
| Cyanine dye A (having the structure shown below) | 0.042 g |
| Fluorine-based surface active agent (Megafac F780 manufactured by Dainippon Ink and Chemicals, Inc.) | 0.035 g |
| Fluorine-based surface active agent (Megafac F781 (30%) manufactured by Dainippon Ink and Chemicals, Inc.) | 0.070 g |
| 3-Methoxy-4-diazodiphenylamine hexafluorophosphate | 0.030 g |
| Dye obtained by changing a counter ion of Ethyl Violet to 6-hydroxynaphthalene-sulfonic acid | 0.036 g |
| Any one of Compounds 1 to 7 and Comparative Compounds a to d shown below | 0.100 g |

Cyanine dye A

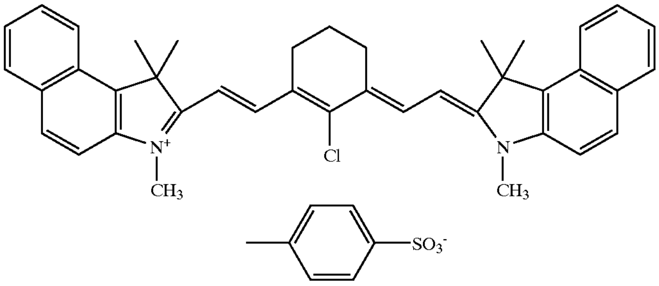

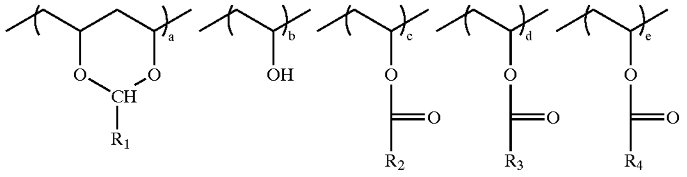

| | $R_1$ | $R_2$ | $R_3$ | $R_4$ | a | b | c | d | e | Mw ($\times 10^4$) |
|---|---|---|---|---|---|---|---|---|---|---|
| 1 | $C_3H_7$ | 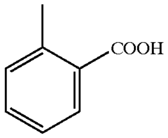 | 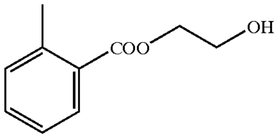 | None | 52 | 17 | 22 | 9 | 0 | 5.0 |
| 2 | $C_3H_7$ | 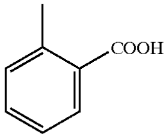 | None | $CH_3$ | 52 | 24 | 22 | 0 | 2 | 3.8 |
| 3 | $C_3H_7$ | 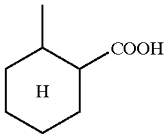 | None | $CH_3$ | 74 | 6 | 19 | 0 | 1 | 2.9 |

-continued

Coating Solution for Image-Recording Layer 1

| | | | | | | | | | | |
|---|---|---|---|---|---|---|---|---|---|---|
| 4 | $C_3H_7$ | 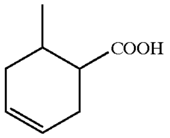 | None | $CH_3$ | 52 | 24 | 22 | 0 | 2 | 4.4 |
| 5 | $C_3H_7$ | 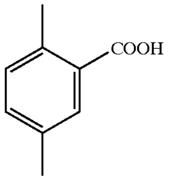 | None | $CH_3$ | 55 | 28 | 15 | 0 | 2 | 5.0 |
| 6 | $C_2H_5$ | 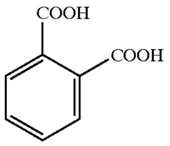 | 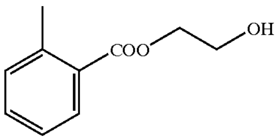 | None | 52 | 15 | 24 | 10 | 0 | 4.0 |
| 7 | $C_3H_7$ | $CH_2CH_2COOH$ | None | $CH_3$ | 52 | 27 | 16 | 0 | 2 | 6.0 |
| a | $C_3H_7$ | None | None | $CH_3$ | 52 | 46 | 0 | 0 | 2 | 4.0 |
| b | | 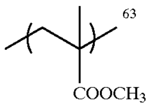 | 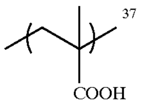 | | | | | | | |
| c | | 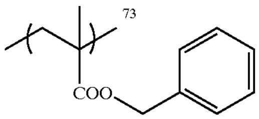 | 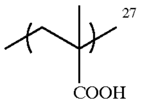 | | | | | | | |
| d | | 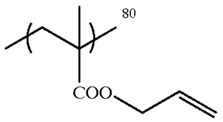 | 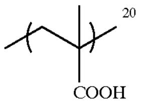 | | | | | | | |

<Performance Evaluation of Lithographic Printing Plate>

With each of the lithographic printing plates of. Examples 1 to 7, Comparative Examples 1 to 4 and Comparative Example 5 to which neither Compounds 1 to 7 nor Comparative Compounds a to d was added, the performance evaluation was conducted according to the criteria described below. The results of the evaluation are shown in Table 1 below.

(Sensitivity and Development Latitude)

The lithographic printing plate precursor was subjected to solid exposure using Trendsetter #3244MT (manufactured by Creo Inc.; wavelength: 830 nm) with an output of from 3 to 12 W every 1 W at a main scanning speed (rotation number) of 150 rpm, and development using an automatic developing machine (PS processor 900H manufactured by Fuji Photo film Co., Ltd.) fed with a developer (electric conductivity: 83 mS/cm) shown below and a rinse solution (FP-2W manufactured by Fuji Photo film Co., Ltd.) (1:7). The exposure amount necessary for obtaining clearness (transparency) in the exposed area was defined as sensitivity.

Developer:

| | |
|---|---|
| Pure water | 870.0 g |
| Sorbitol (59.5% by weight) | 122.4 g |
| KOH (48% by weight) | 61.9 g |
| Nonionic surface active agent (Paionin D1107 manufactured by Takemoto Oil and Fat Co., Ltd.) | 0.5 g |

Separately, the lithographic printing plate precursors were exposed at a 50% dot area rate of 175 lines per inch using the same setter as above at 9 W and a main scanning speed (rotation number) of 150 rpm and developed with four kinds of developers, i.e., the same developer as above, a developer prepared by bubbling of carbon dioxide so as to have electric conductivity of 80 mS/cm, a developer prepared by bubbling of carbon dioxide so as to have electric conductivity of 75 mS/cm, and a developer prepared by bubbling of carbon dioxide so as to have electric conductivity of 70 mS/cm, respectively. With the sample developed with each developer, the 50% dot area rate of 175 lines per inch was determined from the value of density measured by a reflection densitometer (D19C manufactured by Gretag) according to the Yule-Nielsen equation, and a variation range of the 50% dot area rate between the developers was observed. As the variation range of the 50% dot area rate is small, the development latitude becomes better. The development latitude is practically acceptable, when the variation range of the 50% dot area rate is Δ5% or less. Similarly, reproducibility of a 1% dot area rate of 175 lines per inch was visually observed on the printing plate obtained and a remaining rate of the 1% dot was classified according to ten level evaluation of from 0 (the 1% dot was not observed) to 10 (all of the 1% dot were reproduced).

(Press Life)

Using a printing plate obtained by development with the developer having electric conductivity of 75 mS/cm described above, printing was performed by a printing machine (Heidel KOR-D manufactured by Heidelberg Co.) on woodfree parer. During the printing procedure, the printing plate was cleaned with a cleaner liquid (Plate Cleaner CL-2 manufactured by Fuji Photo Film Co., Ltd.) every 5,000 sheets printing, and the final number of printed sheets obtained was determined. The final number of printed sheets means a number of printed sheets before the occurrence of so-called plate deficiency, which is a phenomenon wherein printing ink does not attach partly to the image area caused by decrease in thickness of the image-recording layer of lithographic printing plate. The press life was evaluated using the final number of printed sheets.

TABLE 1

| No | Compound Added | Sensitivity (W) | Electric Conductivity of Developer 83 ms/cm | 80 ms/cm | 75 ms/cm | 70 ms/cm | Press Life (sheet) |
|---|---|---|---|---|---|---|---|
| Example 1 | 1 | 4 | 45%/7 | 50%/10 | 52%/10 | 52%/10 | 120,000 |
| Example 2 | 2 | 4 | 50%/10 | 50%/10 | 50%/10 | 53%/10 | 140,000 |
| Example 3 | 3 | 5 | 50%/8 | 50%/10 | 52%/10 | 52%/10 | 150,000 |
| Example 4 | 4 | 4 | 50%/8 | 50%/10 | 50%/10 | 52%/10 | 140,000 |
| Example 5 | 5 | 5 | 50%/8 | 50%/10 | 52%/10 | 52%/10 | 150,000 |
| Example 6 | 6 | 4 | 48%/9 | 50%/10 | 52%/10 | 52%/10 | 130,000 |
| Example 7 | 7 | 5 | 47%/9 | 50%/10 | 50%/10 | 53%/10 | 120,000 |
| Comparative Example 1 | a | >12 | Solid | Solid | Solid | Solid | — |
| Comparative Example 2 | b | 4 | No image/0 | No image/0 | 42%/2 | 55%/10 | 50,000 |
| Comparative Example 3 | c | 7 | No image/0 | 45%/7 | 55%/10 | Solid | 60,000 |
| Comparative Example 4 | d | 8 | No image/0 | 47%/8 | 55%/10 | Solid | 60,000 |
| Comparative Example 5 | None | 6 | No image/0 | 40%/0 | 52%/9 | 54%/10 | 70,000 |

From the results shown in Table 1 it can be seen that the lithographic printing plate precursor containing the acid-modified polyvinyl acetal resin in the image-recording layer thereof according to the present invention is excellent in both the development latitude and the printing durability in comparison with Comparative Examples 1 to 5. Specifically, it is apparent that the comparative example not containing any polyvinyl acetal resin and the comparative examples containing an unmodified polyvinyl acetal resin are unsatisfactory in the development latitude and printing durability.

The positive working photosensitive lithographic printing plate precursor for infrared laser containing a polyvinyl acetal resin including an epoxy group and an acid group has an advantage of being used with high sensitivity and suitably as a lithographic printing plate precursor for direct plate-making, which is improved in the low image-forming property of an image-recording layer using an aqueous alkali solution-soluble polymer compound, has no restrictions on place of handling, and exhibits good stability of sensitivity against the variation of concentration of a developer, i.e., development latitude and press life.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a support having provided thereon an image-recording layer containing a substance that absorbs light to generate heat, an aqueous alkali solution-soluble resin having phenolic hydroxy group and a polyvinyl acetal resin including an acid group having a pKa of not more than 5, Formula (I)

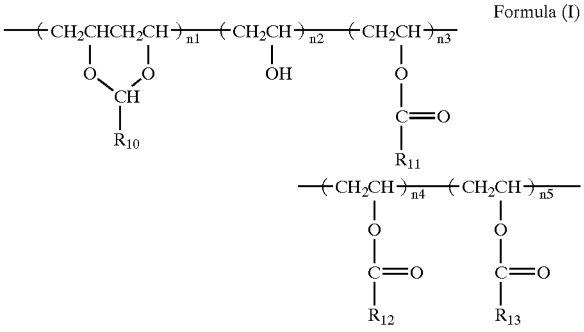

wherein $R_{10}$ represents an alkyl group which may have a substituent or a hydrogen atom; $R_{11}$ represents an unsubstituted alkyl group; $R_{12}$ represents an aliphatic or aromatic hydrocarbon group having a carboxylic acid group; $R_{13}$ represents an aliphatic or aromatic hydrocarbon group having at least one group selected from a hydroxy group and a cyano group, which may have other substituent; $n_1$, $n_2$, $n_3$, $n_4$ and $n_5$ each represent a mol % of each repeating unit in the following range; $n_1$=5 to 85, $n_2$=0 to 60, $n_3$=0 to 20, $n_4$=3 to 60 and $n_5$=0 to 60.

2. The lithographic printing plate precursor as claimed in claim 1, wherein the polyvinyl acetal resin is a polyvinyl acetal resin having an ester linkage group with an organic acid selected from the group consisting of 1,2-cyclohexanedicarboxylic acid, tetrahydrophthalic acid, phthalic acid and trimellitic acid.

3. The lithographic printing plate precursor as claimed in claim 1, wherein a content of an acid group in the polyvinyl acetal resin is in a range of from 0.1 to 6 milliequivalent in terms of acid content per g of the resin.

4. The lithographic printing plate precursor as claimed in claim 1, wherein a content of the polyvinyl acetal resin is from 0.5 to 20% by weight based on the total solid content of the image-recording layer.

5. The lithographic printing plate precursor as claimed in claim 1, wherein the image-recording layer further contains a copolymer containing as a copolymerization component, at least one monomer selected from monomers (a) to (c) described below in an amount of not less than 10% by mole;

(a) A monomer having a sulfonamido group, in which at least one hydrogen atom is bonded to the nitrogen atom, per molecule, (b) A monomer having an active imino group represented by the formula shown below, per molecule,

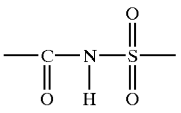

(c) A monomer selected from an acrylamide, a methacrylamide, an acrylic ester and a methacrylic ester each containing a phenolic hydroxy group, and a hydroxystyrene.

6. The lithographic printing plate precursor as claimed in claim 5, wherein the monomer (a) is a low molecular compound represented by any one of the following formulas (II) to (VI):

(II)

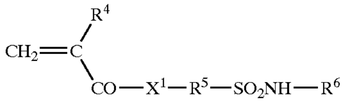

(III)

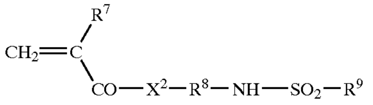

(IV)

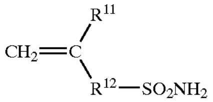

-continued (V)

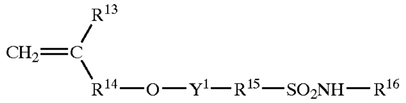

(VI)

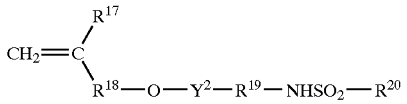

wherein $X^1$ and $X^2$ each represent —O— or —$NR^{10}$—; $R^4$ and $R^7$ each represent a hydrogen atom or a methyl group; $R^5$, $R^8$, $R^{12}$, $R^{15}$ and $R^{19}$ each represent an alkylene group having from 1 to 12 carbon atoms, which may have a substituent, a cycloalkylene group having up to 12 carbon atoms, which may have a substituent, an arylene group having up to 12 carbon atoms, which may have a substituent or an aralkylene group having up to 12 carbon atoms, which may have a substituent; $R^6$, $R^{10}$ and $R^{16}$ each represent an alkyl group having from 1 to 12 carbon atoms, which may have a substituent, a cycloalkyl group having up to 12 carbon atoms, which may have a substituent, an aryl group having up to 12 carbon atoms, which may have a substituent or an aralkyl group having up to 12 carbon atoms, which may have a substituent; $R^9$ and $R^{20}$ each represent an alkyl group having from 1 to 12 carbon atoms, which may have a substituent, a cycloalkyl group having up to 12 carbon atoms, which may have a substituent, an aryl group having up to 12 carbon atoms, which may have a substituent or an aralkyl group having up to 12 carbon atoms, which may have a substituent; $R^{11}$, $R^{13}$ and $R^{17}$ each represent a hydrogen atom or a methyl group; $R^{14}$ and $R^{18}$ each represent a single bond or an alkylene group having from 1 to 12 carbon atoms, which may have a substituent, a cycloalkylene group having up to 12 carbon atoms, which may have a substituent, an arylene group having up to 12 carbon atoms, which may have a substituent or an aralkylene group having up to 12 carbon atoms, which may have a substituent; and $Y^1$ and $Y^2$ each represent a single bond or —CO—.

7. The lithographic printing plate precursor as claimed in claim 1, wherein the substance that absorbs light to generate heat is a pigment or dye, which absorbs an infrared ray or near infrared ray.

8. The lithographic printing plate precursor as claimed in claim 1, wherein the image-recording layer further contains a substance that is heat-decomposable and substantially decreases solubility of the aqueous alkali solution-soluble resin in the undecomposed state.

* * * * *